(12) United States Patent
Park et al.

(10) Patent No.: US 7,638,407 B2
(45) Date of Patent: Dec. 29, 2009

(54) METHOD FOR FORMING CAPACITOR OF SEMICONDUCTOR DEVICE

(75) Inventors: Cheol Hwan Park, Gyeonggi-do (KR); Ho Jin Cho, Gyeonggi-do (KR); Jae Soo Kim, Seoul (KR); Dong Kyun Lee, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/265,759

(22) Filed: Nov. 6, 2008

(65) Prior Publication Data

US 2009/0275186 A1    Nov. 5, 2009

(30) Foreign Application Priority Data

Apr. 30, 2008    (KR) .................. 10-2008-0040667

(51) Int. Cl.
*H01L 21/20*    (2006.01)

(52) U.S. Cl. ................. 438/396; 257/E21.648

(58) Field of Classification Search .......... 438/253, 438/381, 387, 396, 397; 257/E21.646, E21.647, 257/E21.648

See application file for complete search history.

(56) References Cited

U.S. PATENT DOCUMENTS

2006/0014385 A1*   1/2006   Kim et al. ............... 438/680
2006/0246678 A1*   11/2006  Manning ................. 438/396

* cited by examiner

*Primary Examiner*—Brook Kebede
(74) *Attorney, Agent, or Firm*—Ladas & Parry LLP

(57) ABSTRACT

Forming a capacitor of a semiconductor device includes forming an interlayer dielectric having holes over a semiconductor substrate. A conductive layer is then formed on surfaces of the holes and on the upper surface of the interlayer dielectric. A silicon-containing conductive layer is formed by flowing a silicon source gas for the semiconductor substrate formed with the conductive layer, so that silicon atoms can penetrate into the conductive layer. The silicon-containing conductive layer prevents etchant from infiltrating the interlayer dielectric below the silicon-containing conductive layer.

18 Claims, 3 Drawing Sheets

METHOD FOR FORMING CAPACITOR OF SEMICONDUCTOR DEVICE

CROSS-REFERENCE TO RELATED APPLICATIONS

The present application claims priority to Korean patent application number 10-2008-0040667 filed on Apr. 30, 2008, which is incorporated herein by reference in its entirety.

BACKGROUND OF THE INVENTION

The present invention relates generally to a method for forming a capacitor of a semiconductor device; and more particularly, to a method for forming a capacitor of a semiconductor device which can prevent a bunker defect from occurring in an interlayer dielectric when forming a cylinder type storage electrode.

Various techniques for obtaining a capacitor having high capacitance have been proposed in the art as a result of the rapid increase in the demand for semiconductor memory devices. A typical capacitor can be understood as having a structure in which a dielectric is interposed between storage electrodes and plate electrodes. The capacitance of the capacitor is proportional to the surface area of an electrode and the dielectric constant of the dielectric and is inversely proportional to the distance between electrodes, that is, the thickness of the dielectric. Methods for obtaining a capacitor having high capacitance include: using a dielectric having a high dielectric constant, increasing the surface area of an electrode, or decreasing the distance between electrodes. In this regard, limitations exist in decreasing the distance between electrodes (that is, the thickness of the dielectric). These limitations have caused researchers to look more actively in the direction of dielectrics having high dielectric constants and methods of increasing the surface area of an electrode.

In order to increase the surface area of an electrode three-dimensional structures, including concave type and cylinder type storage electrodes, are being utilized rather than simply looking at capacitors as two-dimensional elements. When comparing these types, the cylinder type storage electrode has a wider electrode area than the concave type storage electrode in which only an inner surface is utilized as an electrode area, because the cylinder type storage electrode has a CIAIC (cathode-insulator-anode-insulator-cathode) structure in which both inner and outer surfaces can be utilized as an electrode area. Therefore, the cylinder type storage electrode can be considered advantageous when applied in the manufacturing method of a semiconductor device having high capacity.

Hereafter, a conventional method for forming a capacitor of a semiconductor device having a cylinder type storage electrode will be briefly described.

First, a mold insulation layer is deposited on a semiconductor substrate having storage node contact plugs. The mold insulation member is then etched to define holes that expose the storage node contact plugs. A conductive layer comprising, for example, a TiN layer is then deposited on the mold insulation layer and the surfaces of the holes. The portions of the conductive layer deposited on the mold insulation layer are then removed, and thereafter the mold insulation layer is removed through a dip-out process to form cylinder type storage electrodes. Next, by sequentially forming a dielectric layer and plate electrodes on the storage electrodes, capacitors are formed.

However, in the conventional art as described above, the nature of the TiN layer (as the conductive layer for storage nodes) is such that the TiN layer grows into the shape of a column having large stress. Therefore, subsequent to the formation of the TiN layer (as the conductive layer for storage nodes), grain boundaries, pinholes or cracks are likely to occur in the TiN layer.

Moreover, if the TiN layer is deposited with an increased thickness in order to elevate the capacity, a phenomenon occurs in the subsequent dip-out process, in which an etchant infiltrates to the bottoms of the storage electrodes through the grain boundaries, the pinholes or the cracks in the TiN layer. Thus, when the portions of the interlayer dielectric adjacent to the bottoms of the storage electrodes are etched by the infiltrated etchant, bunker defects are caused.

As a result of the bunker defects in the interlayer dielectric, the probability of a short circuit between the storage electrodes or subsequently formed plate electrodes and the bit lines increases, and the probability of bridging between adjoining storage electrodes also increases, which in turn causes the manufacturing yield to decrease and the reliability of the semiconductor device to deteriorate.

SUMMARY OF THE INVENTION

Embodiments of the present invention are directed to a method for forming a capacitor of a semiconductor device which can prevent a bunker defect from occurring in an interlayer dielectric when forming a cylinder type storage electrode.

Also, embodiments of the present invention are directed to a method for forming a capacitor of a semiconductor device which can prevent a bunker defect from occurring in an interlayer dielectric, thereby preventing short-circuiting between a storage electrode or a plate electrode and a bit line and also preventing bridging of adjoining storage electrodes.

Also, embodiments of the present invention are directed to a method for forming a capacitor of a semiconductor device which can prevent short-circuiting between a storage electrode or a plate electrode and a bit line and which can also prevent bridging of adjoining storage electrodes, thereby increasing the manufacturing yield and improving the reliability of a semiconductor device.

In one aspect of the present invention, a method for forming a capacitor of a semiconductor device comprises the steps of forming an interlayer dielectric having holes over a semiconductor substrate; forming a conductive layer on surfaces of the holes and on the interlayer dielectric; and forming a silicon-containing conductive layer by flowing a silicon source gas for the semiconductor substrate formed with the conductive layer so that silicon atoms can penetrate into the conductive layer.

The conductive layer may comprise a TiN layer.

The TiN layer may be formed using any one precursor of $TiCl_4$, $TDMAT(Ti(N[CH_3]_2)_4)$ and $TDEAT(Ti(N[CH_2CH_3]_2)_4)$, and $NH_3$ and $H_2$ gases.

The TiN layer may be formed under pressure in the range of 10~100 Torr.

The step of forming the conductive layer may be implemented through sequential flow deposition (SFD) at a temperature in the range of 500~700° C.

The flow of the silicon source gas may be implemented at a temperature of 200~600° C.

The silicon source gas comprises any one gas of $SiH_4$, $Si_2H_6$, $SiH_2Cl_2$ and $(SiH_3)_3N$.

Between the step of forming the conductive layer and the step of forming the silicon-containing conductive layer, the method further comprises the step of removing portions of the conductive layer which are formed on the interlayer dielectric, such that storage electrodes are formed.

After the storage electrodes are formed, the method further comprises the step of annealing the resultant semiconductor substrate.

After the step of annealing the resultant semiconductor substrate, the method further comprises the steps of removing the interlayer dielectric; and forming sequentially a dielectric layer and plate electrodes on the storage electrodes.

Alternatively, after the step of forming the silicon-containing conductive layer, the method further comprises the step of removing portions of the silicon-containing conductive layer which are formed on the interlayer dielectric, such that storage electrodes are formed.

After the storage electrodes are formed, the method further comprises the step of annealing the resultant semiconductor substrate.

After the step of annealing the resultant semiconductor substrate, the method further comprises the steps of removing the interlayer dielectric; and forming sequentially a dielectric layer and plate electrodes on the storage electrodes.

DESCRIPTION OF SPECIFIC EMBODIMENTS

In the present invention, after a TiN layer is deposited as a conductive layer for storage electrodes, a silicon source gas is flowed to change the TiN layer a TiSiN layer. The changed TiSiN layer keeps an etchant from passing through the TiSiN layer, which is the material for storage nodes in a subsequent dip-out process. It is therefore possible to prevent the etchant from infiltrating into an interlayer dielectric which is below the storage electrodes made of the TiSiN layer, thereby preventing the occurrence of bunker defects in the interlayer dielectric.

Therefore, in the present invention, it is possible to prevent the storage electrodes or plate electrodes from being short-circuited with underlying bit lines and prevent adjoining storage electrodes from being bridged with one another, both of which are caused by the bunker defects, whereby the manufacturing yield can be increased and the reliability of a semiconductor device can be improved.

Hereafter, embodiments of the present invention will be described in detail with reference to the attached drawings.

FIGS. 1A through 1E are cross-sectional views shown for illustrating the processes of a method for forming a capacitor of a semiconductor device in accordance with an embodiment of the present invention. The method is described in detail below.

Figure 1A:
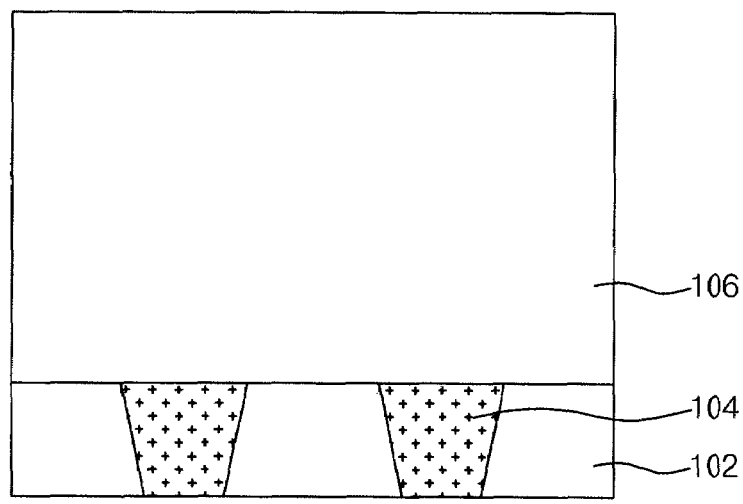
FIGS. 1A through 1E are cross-sectional views shown for illustrating the processes of a method for forming a capacitor of a semiconductor device in accordance with an embodiment of the present invention.

Referring to FIG. 1A, a mold insulation layer 106 is formed over a semiconductor substrate 102 having an understructure including storage node contact plugs 104. The mold insulation layer 106 includes at least one of a PSG layer, a BPSG layer, a PETEOS layer, an $O_3$-USG layer and an HDP layer. Before forming the mold insulation layer 106, preferably, a buffer oxide layer (not shown) and an etch stop layer (not shown) are formed.

Figure 1B:
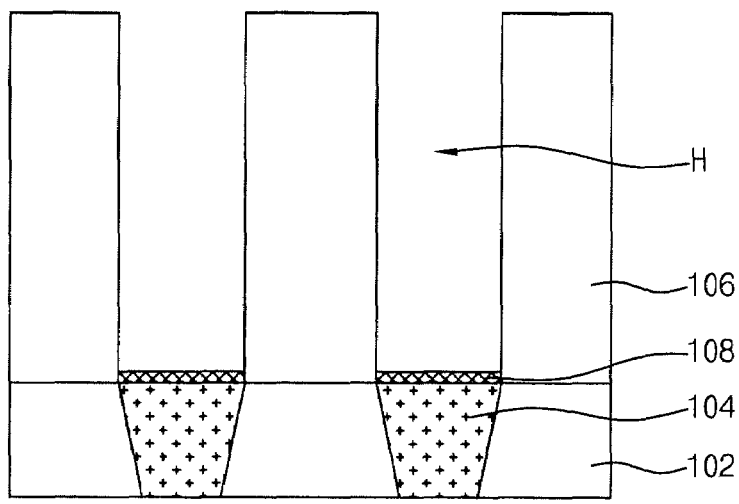

Referring to FIG. 1B, the mold insulation layer 106 is etched to define holes H that expose the storage node contact plugs 104. In order to ensure ohmic contact between the respective storage node contact plugs 104 and a subsequently formed metal storage electrode, a Ti layer may be, for example, deposited on the surfaces of each of the holes H and on the mold insulation layer 106. A high temperature annealing is then conducted so that a metal silicide layer 108 made of a TiSix layer is formed on the storage node contact plugs 104 at the bottoms of the holes H.

Figure 1C:
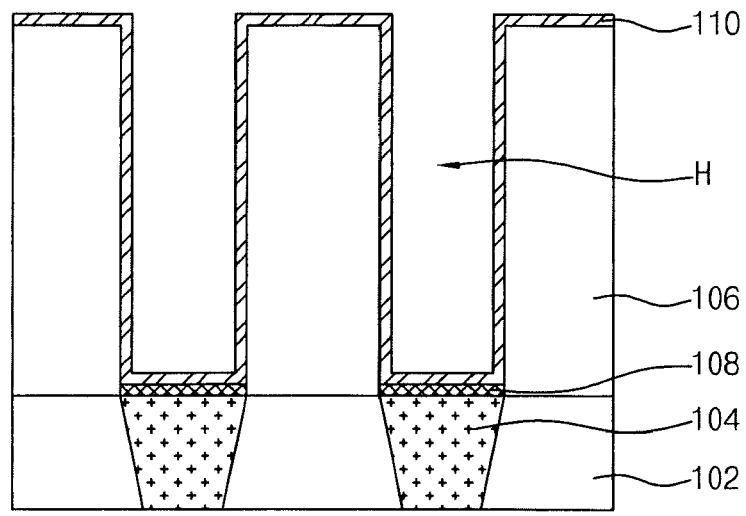

Referring to FIG. 1C, a TiN layer 110 is deposited as a conductive layer for storage electrodes on the surfaces of the holes H including on the surface of the metal silicide layer 108 exposed by the holes and on the upper surface of the mold insulation layer 106. Preferably, the TiN layer 110 is deposited at a temperature in the range of 500~700° C. using sequential flow deposition (SFD). The deposition of the TiN layer 110 is conducted under a pressure in the range of 10~100 Torr using any one precursor of $TiCl_4$, TDMAT(Ti(N[$CH_3$]$_2$)$_4$) and TDEAT(Ti(N[$CH_2CH_3$]$_2$)$_4$, and $NH_3$ and $H_2$ gases.

As an alternative to the TiN layer 110, the conductive layer for storage electrodes may also be at least one of TaN, W, WN, Pt, Ir, HfN and Ru.

Figure 1D:
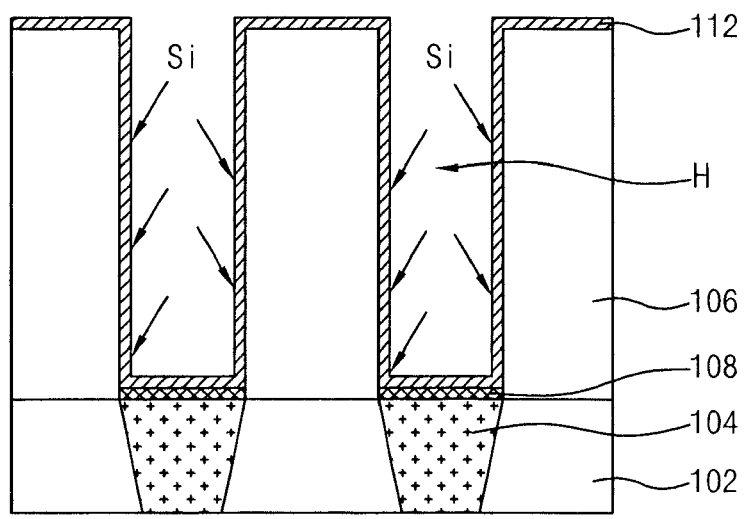

Referring to FIG. 1D, a silicon source gas is flowed over the semiconductor substrate 102 formed with the TiN layer 110 so that silicon atoms can penetrate the TiN layer 110, and through this, a silicon-containing conductive layer, for example, a TiSiN layer 112, is formed. The flow of the silicon source gas is implemented at a temperature in the range of 200~600° C., and any one gas of $SiH_4$, $Si_2H_6$, $SiH_2Cl_2$ and $(SiH_3)_3N$ may be used as the silicon source gas. Annealing is additionally conducted in order to improve the stability of the TiSiN layer 112.

Figure 1E:
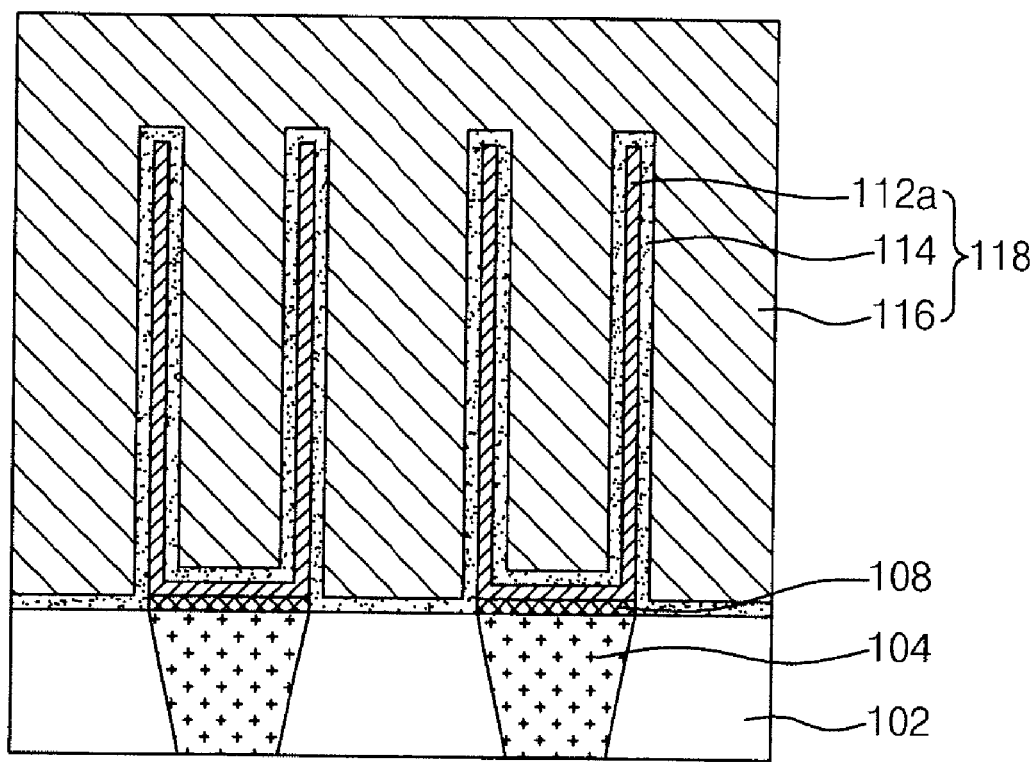

Referring to FIG. 1E, the portions of the TiSiN layer 112 located on the mold insulation layer 106 are removed, and then, the mold insulation layer 106 is removed through a dip-out process. Through this, storage electrodes 112a, which are made of TiSiN and have the shape of cylinders, are formed. A dielectric layer 114 and plate electrodes 116 are sequentially formed on the cylinder-shaped storage electrodes 112a, and as a result, the formation of capacitors 118 according to the embodiment of the present invention is substantially complete.

The dielectric layer 114 may be formed using at least one of $Al_2O_3$, $HfO_2$, $ZrO_2$, $TiO_2$, $Ta_2O_5$, BST (barium strontium titanate) and PZT (plumbum zirconium titanium). The plate electrodes 116 may be formed using at least one of TiN, WN, WN/W, Ru and Si.

In one embodiment of the present invention, the flow of the silicon source gas for changing the TiN layer to the TiSiN layer may be conducted after the portions of the TiN layer present on the mold insulation layer are removed through an etch-back process or a CMP process.

As is apparent from the above description, in the present invention, after a TiN layer is deposited as the material for storage electrodes, a silicon source gas is flowed and the TiN layer is changed to a TiSiN layer. By doing this, it is possible to prevent an etchant from infiltrating into an interlayer dielectric below storage electrodes in a subsequent dip-out process. According to this, the occurrence of bunker defects in the interlayer dielectric can be avoided.

Therefore, in the present invention, it is possible to prevent the storage electrodes or plate electrodes from being short-circuited with underlying bit lines and to prevent adjoining storage electrodes from being bridged with one another due to the bunker defects, whereby the manufacturing yield can be increased and the reliability of a semiconductor device can be improved.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A method for forming a capacitor of a semiconductor device, comprising:
    forming an insulation layer having a hole over a semiconductor substrate;
    forming a conductive layer at least on a surface of the hole; and
    flowing a silicon source gas such that silicon atoms penetrate into the conductive layer, wherein a storage electrode of the capacitor comprises the silicon-containing conductive layer.

2. The method according to claim 1, wherein the conductive layer comprises a TiN layer.

3. The method according to claim 2, wherein the TiN layer is formed using any one precursor of $TiCl_4$, TDMAT($Ti(N[CH_3]_2)_4$) and TDEAT($Ti(N[CH_2CH_3]_2)_4$, and $NH_3$ and $H_2$ gases.

4. The method according to claim 3, wherein the TiN layer is formed under pressure in the range of 10~100 Torr.

5. The method according to claim 1, wherein the step of forming the conductive layer is implemented through sequential flow deposition at a temperature in the range of 500~700° C.

6. The method according to claim 1, wherein the flow of the silicon source gas is implemented at a temperature in the range of 200~600° C.

7. The method according to claim 1, wherein the silicon source gas comprises any one gas of $SiH_4$, $Si_2H_6$, $SiH_2Cl_2$ and $(SiH_3)_3N$.

8. The method according to claim 1, wherein the conductive layer is formed on an upper surface of the insulation layer and on the surface of the hole, and the method further comprises:
    after forming the conductive layer and before flowing the silicon source gas, removing the portion of the conductive layer formed on the upper surface of the insulation layer, such that a storage electrode is formed.

9. The method according to claim 8, further comprising:
    after the storage electrode is formed, annealing the resultant semiconductor substrate to improve the stability of the conductive layer.

10. The method according to claim 9 further comprising:
    after the step of annealing the resultant semiconductor substrate,
    removing the insulation layer; and
    forming sequentially a dielectric layer and a plate electrode on the storage electrode.

11. The method according to claim 1, wherein the conductive layer is formed on an upper surface of the insulation layer and on the surface of the hole, and the method further comprises:
    after flowing the silicon source gas, removing the portion of the silicon-containing conductive layer formed on the insulation layer, such that the storage electrode comprising the silicon containing conductive layer is formed.

12. The method according to claim 11 further comprising:
    after the storage electrode comprising the silicon containing conductive layer is formed, annealing the resultant semiconductor substrate to improve the stability of the conductive layer.

13. The method according to claim 12, further comprising:
    after annealing the resultant semiconductor substrate,
    removing the insulation layer; and
    forming sequentially a dielectric layer and a plate electrode on the storage electrode comprising the silicon containing conductive layer.

14. A method for forming a capacitor of a semiconductor device, comprising:
    forming an insulation layer having a hole over a semiconductor substrate;
    forming a conductive layer on a surface of the hole;
    flowing a silicon source gas such that silicon atoms penetrate into the conductive layer;
    removing the insulation layer such that a cylindrical electrode comprising the silicon-containing conductive layer is exposed;
    forming a dielectric layer on a surface of the cylindrical electrode;
    forming a second electrode on the dielectric layer.

15. The method according to claim 14, wherein the conductive layer is formed on the upper surface of the insulation layer and on the surface of the hole, and the method further comprises:
    after forming the conductive layer and before flowing the silicon source gas, removing the portion of the conductive layer formed on the upper surface of the insulation layer, such that a cylindrical electrode comprising the conductive layer is formed.

16. The method according to claim 15, further comprising:
    after removing the portion of the conductive layer formed on the upper surface of the insulation layer, annealing the resultant semiconductor substrate.

17. The method according to claim 14, wherein the conductive layer is formed on the upper surface of the insulation layer and on the surface of the hole, and the method further comprises:
    after flowing the source gas and before removing the insulation layer, removing the portion of the silicon-containing conductive layer formed on the interlayer dielectric, such that cylindrical electrodes comprising the silicon-containing conductive layer are formed.

18. The method according to claim 17, further comprising:
    after forming the cylindrical electrodes comprising the silicon-containing conductive layer, annealing the resultant semiconductor substrate.

* * * * *